US007030425B1

(12) United States Patent
Horch et al.

(10) Patent No.: US 7,030,425 B1
(45) Date of Patent: Apr. 18, 2006

(54) BURIED EMITTER CONTACT FOR THYRISTOR-BASED SEMICONDUCTOR DEVICE

(75) Inventors: Andrew Horch, Sunnyvale, CA (US); Scott Robins, San Jose, CA (US)

(73) Assignee: TRAM, Inc., Milpitas, CA (US)

( * ) Notice: Subject to any disclaimer, the term of this patent is extended or adjusted under 35 U.S.C. 154(b) by 0 days.

(21) Appl. No.: 10/262,696

(22) Filed: Oct. 1, 2002

(51) Int. Cl.
*H01L 29/74* (2006.01)
(52) U.S. Cl. ........................... 257/119; 257/133
(58) Field of Classification Search ........ 257/119–176, 257/903; 365/180
See application file for complete search history.

(56) References Cited

U.S. PATENT DOCUMENTS

| | | | | |
|---|---|---|---|---|
| 5,168,345 A | * | 12/1992 | Brossart | 257/668 |
| 5,708,302 A | * | 1/1998 | Azuma et al. | 257/751 |
| 5,738,948 A | * | 4/1998 | Ikeda et al. | 428/663 |
| 5,909,042 A | * | 6/1999 | Azuma et al. | 257/295 |
| 6,104,045 A | | 8/2000 | Forbes et al. | |
| 6,184,056 B1 | * | 2/2001 | Nakamura et al. | 438/57 |
| 6,204,107 B1 | * | 3/2001 | Lin et al. | 438/238 |
| 6,225,165 B1 | | 5/2001 | Noble, Jr. et al. | |
| 6,229,161 B1 | | 5/2001 | Nemati et al. | |
| 6,437,380 B1 | * | 8/2002 | Lim et al. | 257/295 |
| 6,489,645 B1 | * | 12/2002 | Uchiyama | 257/295 |
| 2002/0190265 A1 | * | 12/2002 | Hsu et al. | 257/107 |

OTHER PUBLICATIONS

K. DeMeyer, S. Kubicek and H. van Meer, *Raised Source/Drains with Disposable Spacers for sub 100 nm CMOS technologies*, Extended Abstracts of International Workshop on Junction Technology 2001.

Mark Rodder and D. Yeakley, *Raised Source/Drain MOSFET with Dual Sidewall Spacers,* IEEE Electron Device Letters, vol. 12, No. 3, Mar. 1991.

Yang-Kyu Choi, Daewon Ha, Tsu-Jae King and Chenming Hu, *Nanoscale Ultrathin Body PMOSFETs With Raised Selective Germanium Source/Drain*, IEEE Electron Device Letters, vol. 22, No. 9, Sep. 2001.

(Continued)

*Primary Examiner*—Howard Weiss
*Assistant Examiner*—Marcos D. Pizarro-Crespo
(74) *Attorney, Agent, or Firm*—Crawford Maunu PLLC

(57) ABSTRACT

A semiconductor device includes a thyristor having at least one body region thereof disposed in a substrate, and a filled trench having a conductive material. According to an example embodiment of the present invention, a conductive material having a narrow upper portion over a relatively wide lower portion is in a filled trench adjacent to at least one thyristor body region in a substrate. In one implementation, a thyristor control port is located over the wide lower portion and adjacent to the narrow upper portion of the conductive shunt and is adapted for capacitively coupling to the thyristor body region in the substrate for controlling current in the thyristor. In another implementation, the conductive material is electrically coupled to a buried emitter region of the thyristor and arranged for shunting current between the buried emitter region and a circuit node near an upper portion of the conductive material. With these approaches, conductive material can be used to fill a portion of the trench that electrically isolates a portion of a thyristor body in a substrate and/or to shunt current between a circuit node in the substrate, such as a buried emitter region, and an upper circuit node.

15 Claims, 9 Drawing Sheets

OTHER PUBLICATIONS

N. Lindert, Y.-K. Choi, L. Chang, E. Anderson, W.-C. Lee, T.-J. King, J. Bokor, and C. Hu, *Quasi-Planar FinFETs with Selectively Grown Germanium Raised Source/Drain,* 2001 IEEE International SOI Conference, Oct. 1, 2001.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide,* 1998 Symposium on VLSI Technology Digest of Technical Papers.

Hsiang-Jen Huang, Kun-Ming Chen, Tiao-Yuan Huang, Tien-Sheng Chao, Guo-Wei Huang, Chao-Hsin Chien, and Chun-Yen Chang, *Improved Low Temperature Characteristics of P-Channel MOSFETs with $Si_{1-x}Ge_x$ Raised Source and Drain,* IEEE Transactions on Electron Devices, vol. 48, No. 8, Aug. 2001.

Stanley Wolf Ph.D. and Richard N. Tauber Ph.D., *Silicon Processing for The VLSI Era,* vol. 1, 1986, pp. 285-286.

S.M. Sze, *Physics of Semiconductor Devices,* A Wiley-Interscience Publication, Second Edition, 1981, pp. 397 and 442.

Ponomarev et al., *High-Performance Deep SiubMicron CMOS Technologies with Polycrystalline-SeGe Gates,* IEEE Transactions on Electron Devices, vol. 47, No. 4, pp. 848-855, Apr. 2000.

Ponomarev et al., *A 0.13 µm Poly-SiGe Gate CMOS Technology for Low-Voltage Mixed-Signal Applications,* IEEE Transactions on Electron Devices, vol. 47, No. 7, pp. 1507-1513, Jul. 2000.

Ponomarev et al., *Gate-Workfunction Engineering Using Poly-(Se,Ge) for High-Performance 0.18 µm CMOS Technology,* IEDM Tech. Dig., pp. 829-832, Jul. 1997.

* cited by examiner

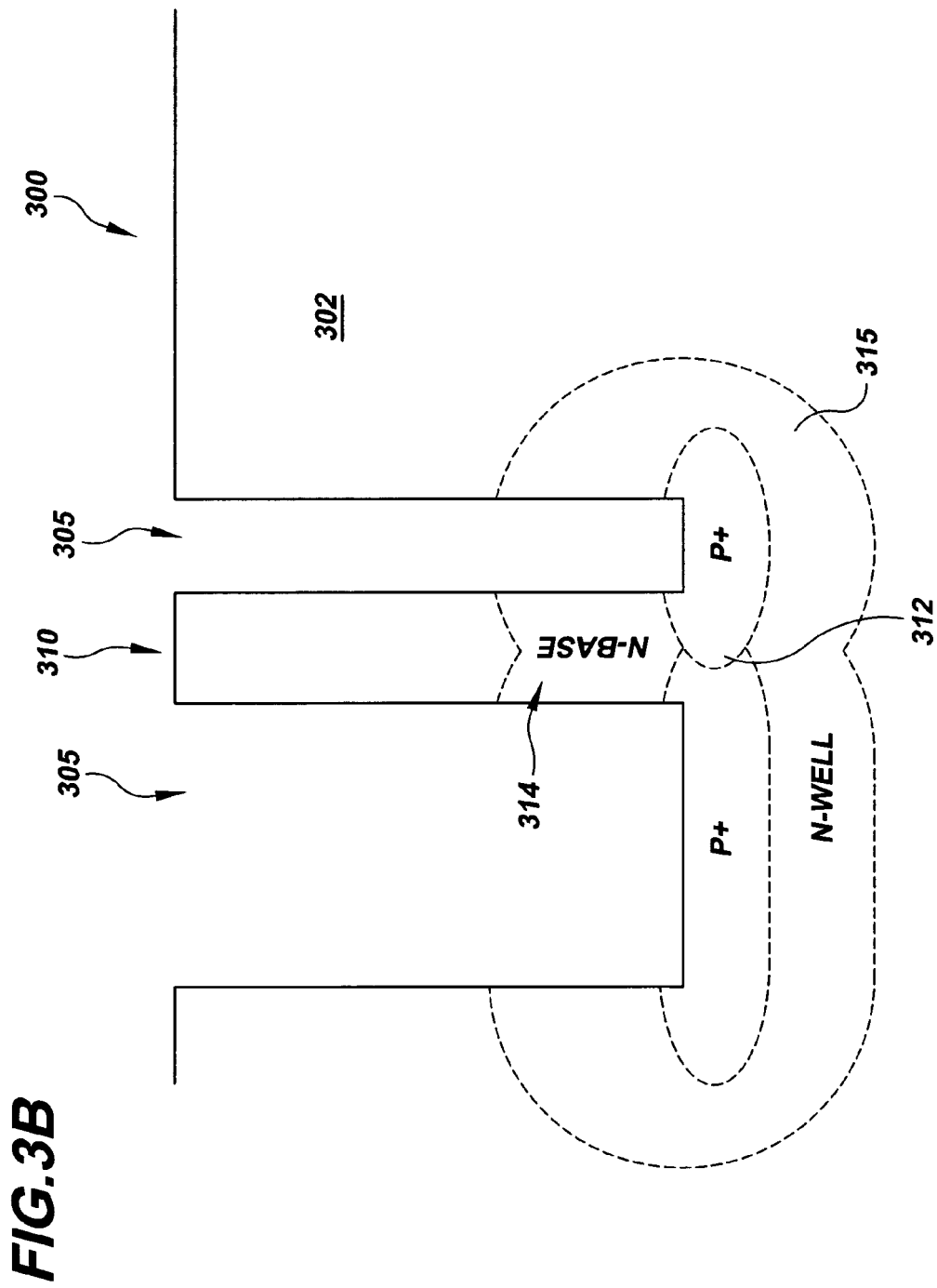

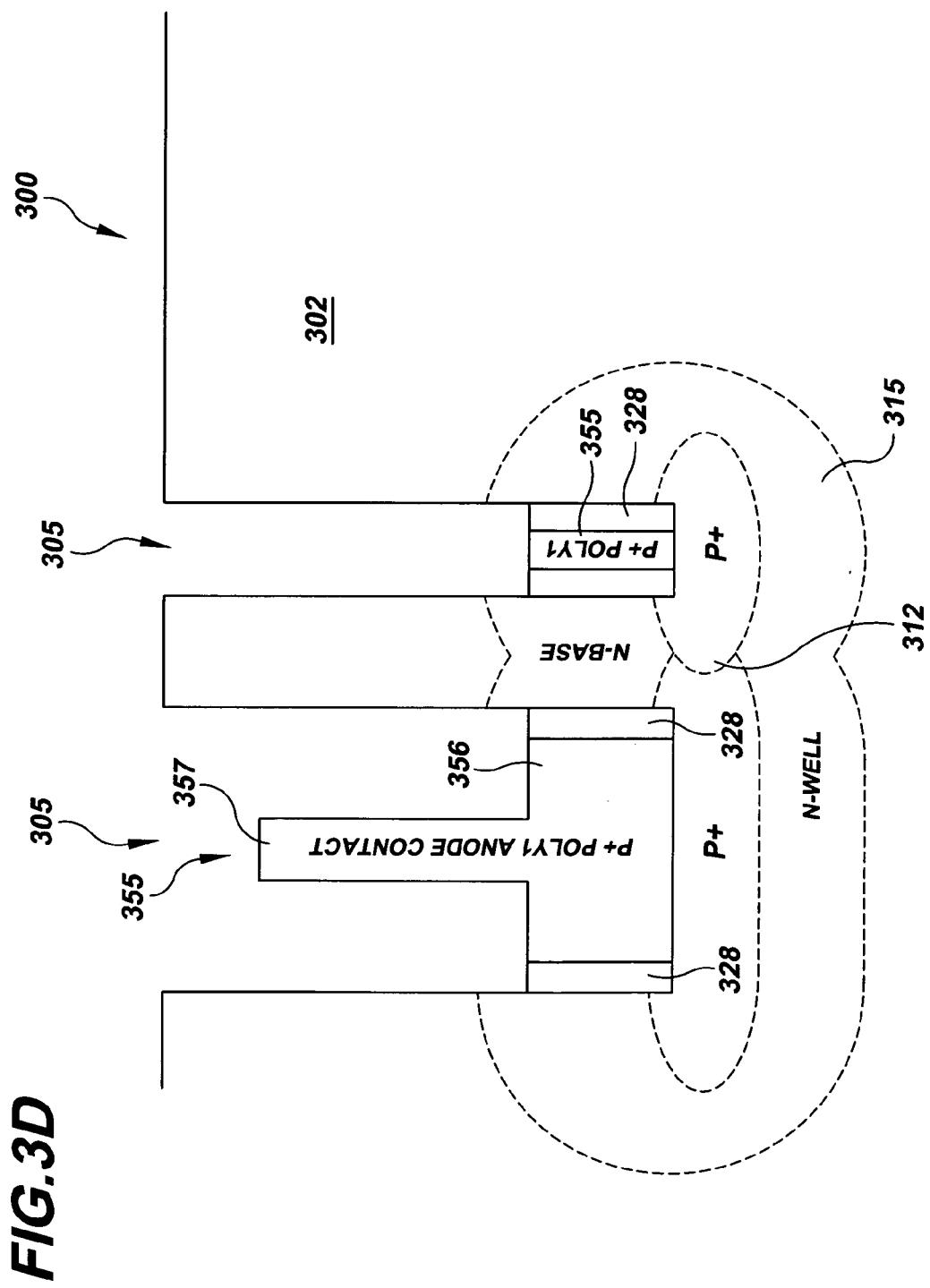

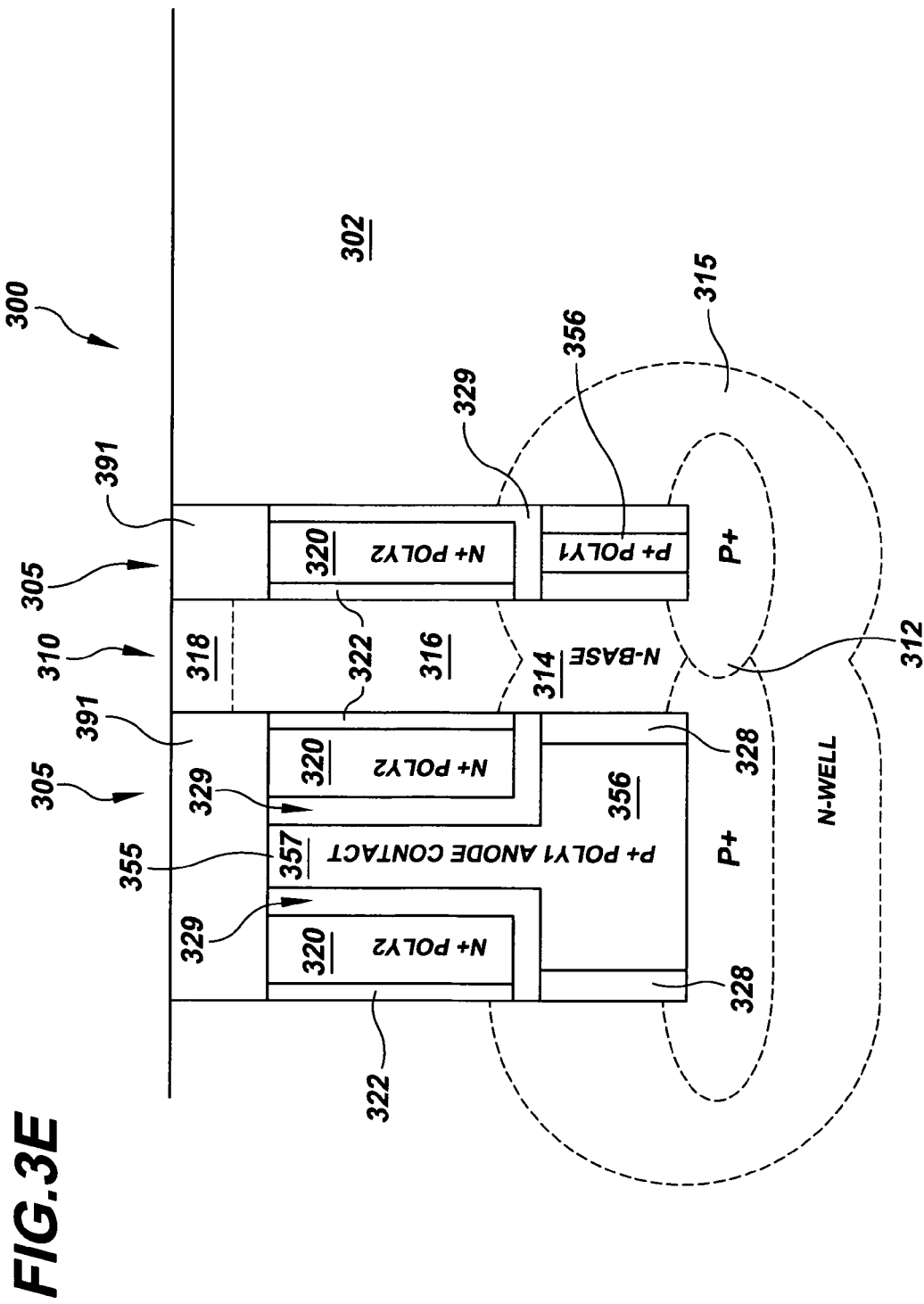

BURIED EMITTER CONTACT FOR THYRISTOR-BASED SEMICONDUCTOR DEVICE

RELATED PATENT DOCUMENTS

The present invention is related to U.S. patent application Ser. No. 10/262,729, entitled "Trench Isolation for Thyristor-based Device," filed on Oct. 1, 2002 and fully incorporated herein by reference.

FIELD OF THE INVENTION

The present invention is directed to semiconductor devices and, more specifically, to thyristor-based semiconductor devices, such as thyristor-based memory devices and other thyristor-based current-switching circuits.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region. For memory-cell applications, another important consideration in semiconductor device design, including those employing thin capacitively-coupled thyristor-type devices, includes forming devices in a very dense array.

In order to achieve dense arrays, it is sometimes desirable to bury circuit nodes in a substrate. However, access to the buried circuit node can be challenging. For instance, it is sometimes desirable to form trenches in the substrate in order to access the buried circuit node. When implemented in high-density applications, trenches having a very high aspect ratio (the ratio of height-to-width of the opening of the trench) are desirable in order to reduce the amount of space taken up by the trench. However, commonly-used insulative materials are difficult to implement when filling trenches having an aspect ratio of greater than 2:1. For instance, when forming insulative material in a high-aspect-ratio trench, the cross-section at middle or upper portions of the trench tend to fill with insulative material before the bottom of the trench is filled, which leaves an unfilled void near the bottom.

These and other design considerations have presented challenges to the implementation of such a thin capacitively-coupled thyristor in bulk substrate applications, and in particular for implementation in highly-dense applications.

SUMMARY

The present invention is directed to overcoming the above-mentioned challenges and others related to the types of devices and applications discussed above and in others. The present invention is exemplified in a number of implementations and applications, some of which are summarized below.

According to an example embodiment of the present invention, a thyristor-including (i.e., thyristor-based) semiconductor device includes a current shunt in a trench that is laterally adjacent to a thyristor body region in a substrate. The current shunt is coupled to a thyristor emitter region buried in the substrate and fills a lower portion of the trench. With this approach, electrical connection to the buried thyristor emitter region is readily achieved by making contact to the upper portion of the shunt.

In a more particular example embodiment of the present invention, the shunt includes a wide lower portion and a relatively narrower upper portion. A thyristor control port is located over the lower portion of the shunt and laterally adjacent to the upper portion of the shunt. An insulative material is disposed between the control port and the current shunt for electrical isolation thereof. The thyristor further includes a base region in the substrate, and the control port is arranged for capacitively coupling to the thyristor base region for controlling current flow therein.

In another implementation, the lower portion of the shunt extends around the thyristor body region in the substrate and fills a lower portion of a relatively narrow portion of the trench. By using the shunt as filler material in the relatively narrow portion of the trench, the filler material is coupled to a circuit node (e.g., a reference voltage line coupled to the buried emitter region). With this approach, the filler material can be prevented from coupling a voltage to the thyristor body region, which is useful for preventing unwanted circuit characteristics, such as carrier accumulation in the thyristor body region.

In another example embodiment of the present invention, the current shunt is formed in a trench having a height:width aspect ratio that is significantly high (e.g., greater than 2:1) such that the formation of insulative material near a bottom of the trench is inhibited. The lower portion of the current shunt is a conductive material, such as polysilicon, that fills the bottom portion of the trench (e.g., as discussed above in connection with a relatively narrower portion of the trench). Insulative material on a sidewall of the trench electrically isolates the current shunt from adjacent circuitry, such as a body region of the thyristor that is adjacent to the trench. With this approach, the conductive shunt can be formed in relatively close proximity to other circuitry while also being electrically insulated therefrom.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIGS. 3A–3E show a semiconductor device at various stages of manufacture, according to another example embodiment of the present invention, in which:

FIG. 3A shows a substrate being etched;

FIG. 3B shows portions of the substrate being ion implanted;

FIG. 3C shows the etched trenches having material filled therein;

FIG. 3D shows the material filled in the trenches in FIG. 3C having been etched; and FIG. 3E shows conductive control ports formed over and adjacent the material etched in FIG. 3D.

Figure 1A:
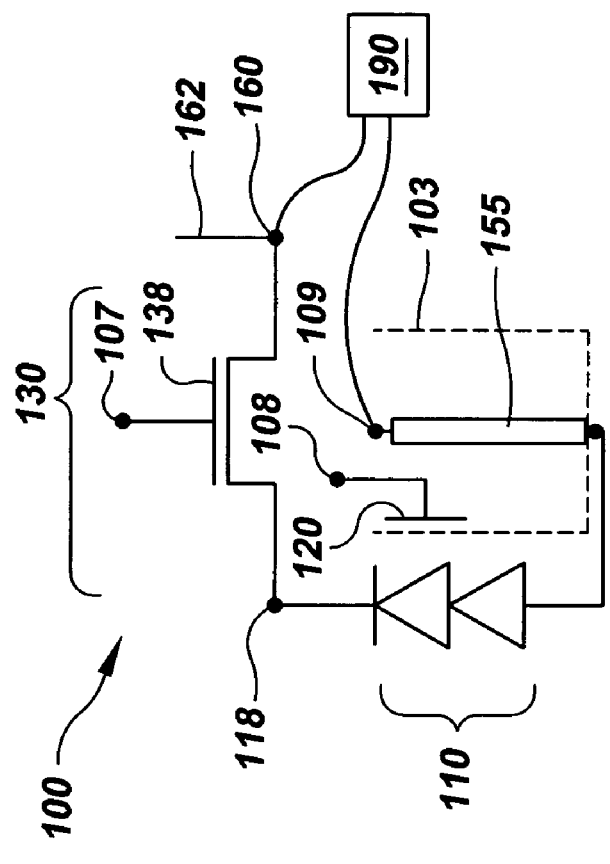
FIG. 1A is a circuit including a thyristor-based device having a current shunt with a varied width, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications benefiting from trench isolation at high aspect ratios, and those benefiting from contact made to a buried thyristor emitter region. While the present invention is not necessarily limited to such applications, various aspects of the invention may be appreciated through a discussion of various examples using this context.

According to an example embodiment of the present invention, a thyristor-based current-switching device includes a filled trench laterally adjacent to a thyristor body region in a substrate. The filled trench includes conductive filler material adapted for coupling a signal to the body region. Insulative material electrically insulates the conductive filler material from a portion of the thyristor body. The filled trench and insulative material also electrically insulate the thyristor body region in the substrate from other circuitry in the device (e.g., the thyristor body is electrically insulated from circuitry on an opposite side of the trench). A portion of the conductive filler material is coupled to a buried thyristor emitter region for shunting current between circuitry coupled to an upper portion of the conductive filler material and the buried emitter region. With this approach, current can be shunted between the buried emitter region and a variety of circuit elements, such as a local interconnect, a reference voltage line or a pass device.

According to a more particular example embodiment of the present invention (going from bottom to top), the filled trench further includes a first insulative liner on a sidewall of the trench, a conductive filler material, a second insulative liner and a thyristor control port. The first insulative liner electrically insulates the conductive filler material from a portion of the thyristor body. The second insulative liner is formed on a sidewall of an upper portion of the trench. In one implementation, a lower portion of the conductive material is wider than an upper portion of the conductive material, wherein the second insulative liner is also formed on a top surface of the wider lower portion of the conductive filler material. The control port is formed contiguously adjacent to the second insulative liner, laterally adjacent to the upper portion of the conductive filler material and, in the implementation where the lower portion of the conductive filler material is relatively wider, the control port is formed over the lower portion. The control port is arranged for capacitively coupling to the thyristor body region for controlling current flow therein, with the thyristor body region being thin enough such that the control port can change the potential across a majority of a cross-section of the thyristor body region. For general information regarding thyristor-based semiconductor applications, and for specific information regarding the control of current flow in a thyristor via a capacitively-coupled control port that may be implemented in connection with the present invention, reference may be made to U.S. Pat. No. 6,229,161 (Nemati, et al.).

The present invention is applicable to a variety of devices and circuit arrangements. FIG. 1A is one such circuit arrangement 100, according to another example embodiment of the present invention. The circuit arrangement 100 includes a thyristor body 110 electrically coupled in series to a pass device 130 (e.g., a transistor) and adapted for storing data at a storage node 118. Control ports 120 and 121 are adapted to control current flow in the thyristor body 110 and the pass device 130, respectively, in response to signals applied to first (WL1) and second (WL2) word lines 107 and 108. A contact 155 is adapted to electrically couple a signal from a reference voltage (Vref) line 109 to a buried emitter region of the thyristor body region 110 via conductive material formed in a trench. The conductive material includes a lower portion in a region 103 of a trench, which also includes the control port 120, such that the lower portion fills a portion of the trench below the control port. In addition, a bit line contact 160 is adapted to electrically couple a signal from a bit line 162 to a source/drain region of the pass device 138. In response to signals applied to first and second word lines 107 and 108, and using signals at the bit line 162 and Vref line 109, the device 100 is adapted for accessing the storage node 118 (e.g., for writing, reading or storing data).

In a more particular implementation, an access controller 190 is electrically coupled to one or more of the first word line 107, the second word line 108, the bit line 162 and the Vref line 109, and is adapted for controlling signals (e.g., pulses) applied thereto. With this approach, data can be stored, retrieved and manipulated at the storage node 118, such as discussed above and in connection with the above-referenced U.S. Patent (Nemati, et al.).

Various ones of the example embodiments described below in connection with the figures share similar features with each other and with FIG. 1A. In each of these figures, certain discussion of similar features having similarly-numbered articles is omitted for brevity.

Figure 1B:
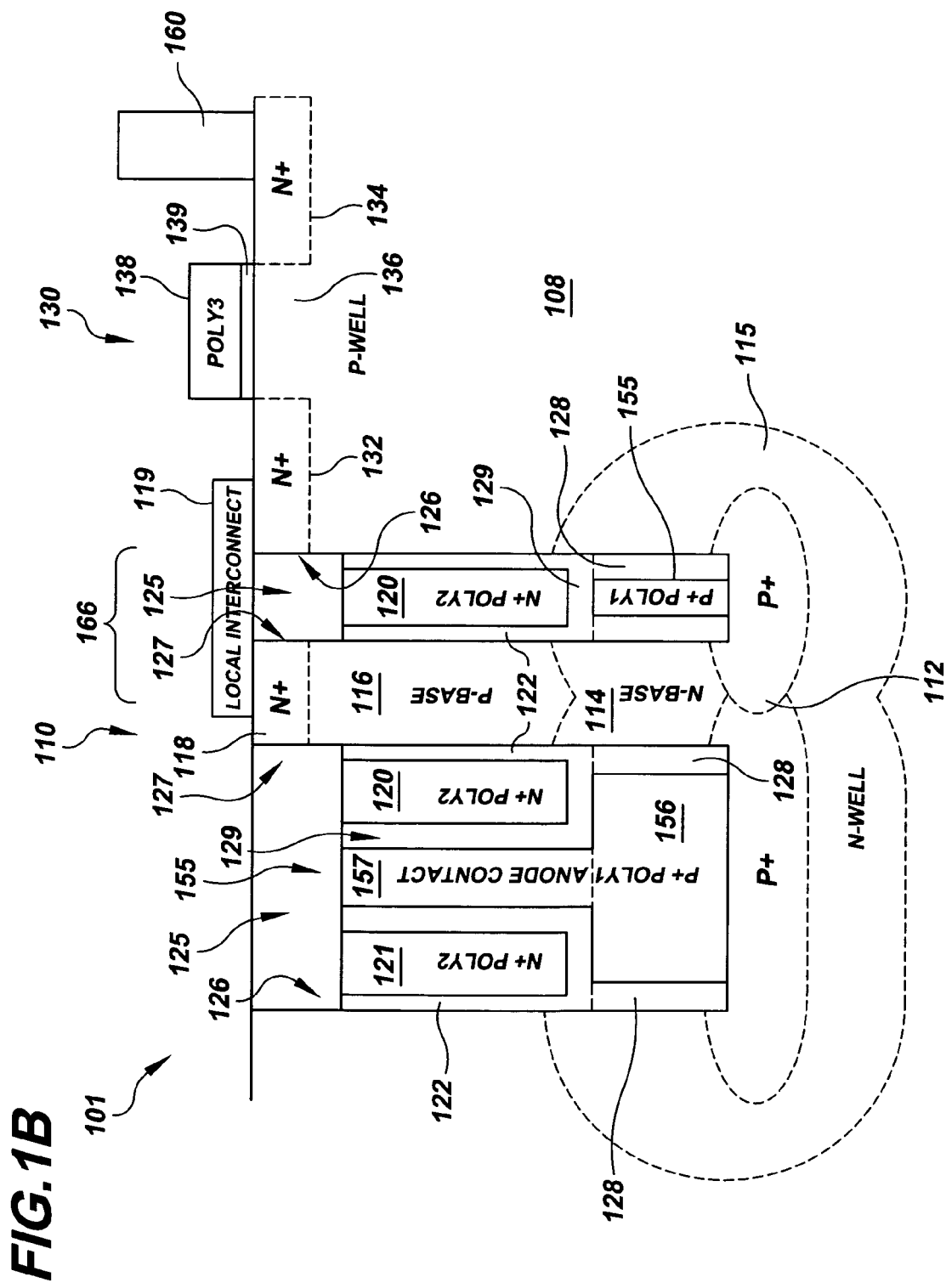
FIG. 1B is a thyristor-based semiconductor device having a current shunt with a varied width, according to another example embodiment of the present invention.

FIG. 1B shows a semiconductor device 101, similar to the circuit shown in FIG. 1A, according to another example embodiment of the present invention. The device 101 includes a thyristor having a body region 110 including P+ emitter region 112, N-base region 114, P-base region 116 and N+ emitter region 118. The P+ emitter region 112 is located in an N-well region 115 (or N-base) disposed in a P-doped substrate 108. The body region 110 is surrounded by a trench 125 having sidewalls 126 and 127, with an insulative material 128 near a bottom of the trench and a dielectric material 122 on a portion of the sidewall 127 that is adjacent to the P-base region 116. A control port 120 is in the trench 125, around the body region and separated therefrom by the dielectric material 122. In response to signals applied thereto, the control port 120 is arranged to capacitively couple to the P-base region 116 for controlling current flow therein.

Conductive filler material 155, having a relatively narrower upper portion 157 and a relatively wider lower portion 156, is in a first portion of the trench 125, with portions of the conductive filler material 155 extending around the body region 110. For an example detailed representation of conductive filler material extending around a body region, see, e.g., inset 301 of FIG. 3A and corresponding discussion below. The conductive filler material 155 is electrically coupled to the P+ anode 112 and is adapted for making electrical contact from the P+ emitter region 112 to a circuit node near an upper surface of the P-doped substrate 108 (e.g., to circuitry, such as an interconnect, over the substrate 10). A portion of the control port 120 is located over the lower portion 156 and adjacent to the upper portion 157 of the P+ conductive filler material 155, with insulative material 129 separating and electrically isolating the control port from the P+ conductive filler material 155. The thyristor body region 110 is electrically isolated from the P+ conductive filler material 155 by insulative material 128.

The device 101 further includes a transistor 130 having N+ source/drain regions 132 and 134 formed in a region of the P-doped substrate 108 and separated by a channel region 136. A gate 138 is formed over the channel region 136 with a gate dielectric material 139 between the gate and the channel. The N+ source/drain region 132 is electrically coupled to the N+ emitter region 118 via a local interconnect 119 (e.g., a conductive material, such as a contact to a first metal layer). The N+ source/drain region 134 is coupled to a conductive contact 160 for coupling to other circuitry (e.g., a bit line). The gate 138 is adapted to control current flow in the channel region 136 between the source/drain regions 132 and 134, and in connection with the control port 120 and the P+ emitter region 112, to control access to the N++emitter region 118 for data storage and manipulation therein.

The shape of the P+ conductive filler material 155 and the insulative materials 128, 129 and 122 in the trench 125 allow the thyristor-based semiconductor device 101 to be placed in close proximity to other devices. For example, an N+ control port 121 can be used in a similar manner as the control port 120 for capacitively coupling a signal to another thyristor body, for example, in an array of devices similar to device 101. The arrangement of the P+ conductive filler material 155 with the insulative materials formed in the trench 125 facilitates highly-dense thyristor implementations. Such high density is particularly useful in memory applications, such as in embedded memory applications. Furthermore, with this approach, the portion of the conductive filler material 155 in a relatively narrower portion 166 of the trench 125 is coupled to a contact node (e.g., to a reference voltage), as is the rest of the conductive filler material 155. This is particularly useful, for example, in preventing the portion of the conductive filler material 155 in the relatively narrower trench 166 from floating to an unwanted voltage level and causing problems such as carrier accumulation in the N base region 114. For more information on implementations including high aspect ratio trenches and contact to a buried emitter region to which the present invention is applicable, reference may be made to the aforementioned U.S. patent application Ser. No. 10/262,729.

Figure 2:
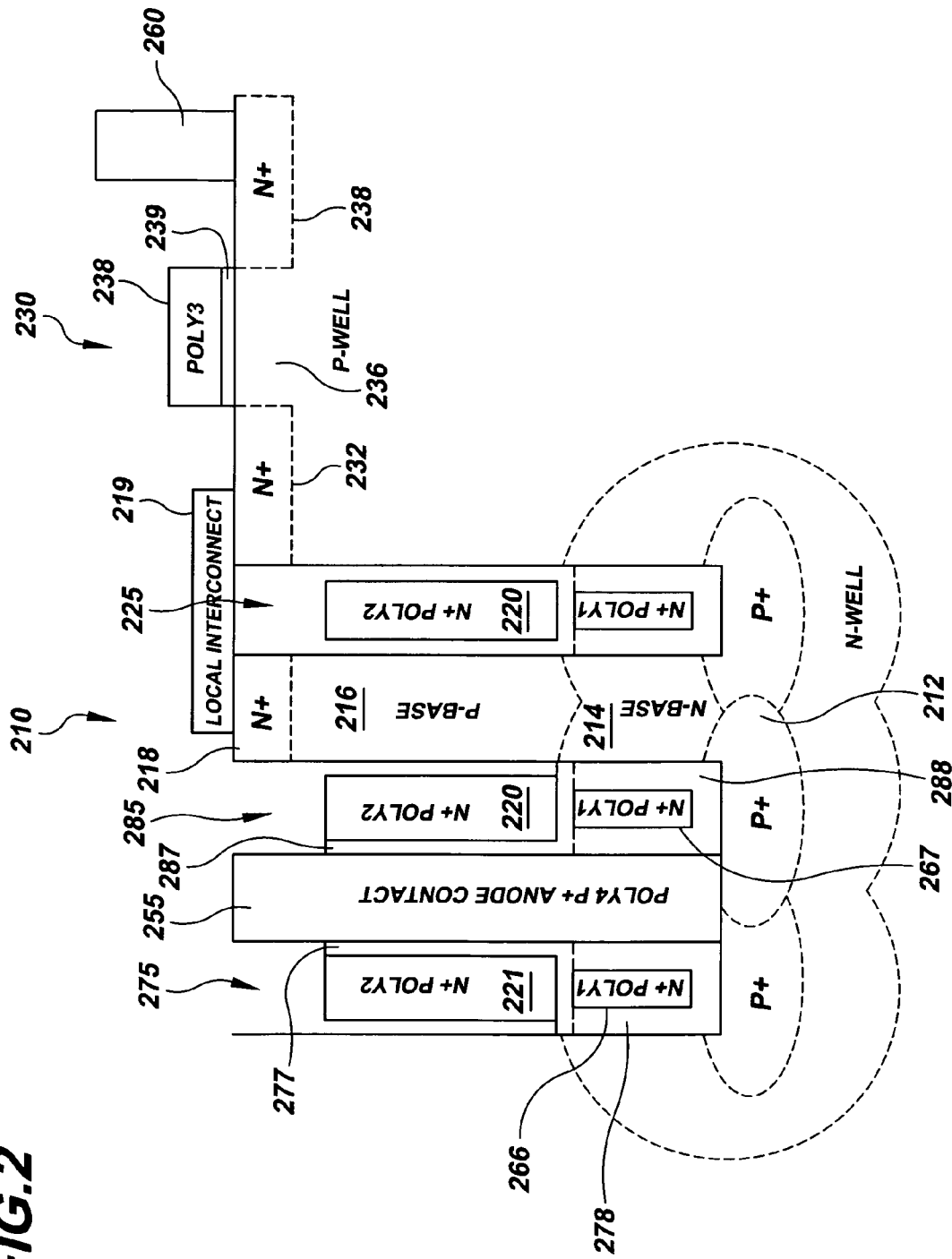
FIG. 2 is a thyristor-based semiconductor device having a current shunt and an insulative portion of a trench including a conductive material, according to another example embodiment of the present invention.

FIG. 2 shows another semiconductor device 210 that could also be implemented in connection with the circuit shown in FIG. 1A, according to another example embodiment of the present invention. For brevity, discussion of various elements of FIG. 2 that are similar to those in FIG. 1B is omitted (e.g., control port 220 in FIG. 2 may be interpreted to correspond to control port 120 in FIG. 1B). In this implementation, the P+ anode contact 155 in FIG. 1B is replaced by a P+ anode contact 255, with conductive material 266 and 267 below control ports 220 and 221. More specifically, the conductive materials 266 and 267 fill a lower portion of trench regions 275 and 285, with insulative materials 278 and 288 electrically isolating the conductive materials 266 and 267 from the P+ anode contact 255 and adjacent thyristor body regions (e.g., region 210), respectively. Filling the lower portion of trenches with conductive material in this manner is particularly useful in applications using trenches having high aspect ratios, such as discussed above, with the conductive material being selected for its ability to fill the lower portion of the trench, for example, without forming voids therein. Insulative materials 277 and 287 are located between the control ports 221 and 220 and the P+ anode contact 255, respectively, and are adapted to electrically isolate the control ports from the P+ anode contact.

Figure 3A:
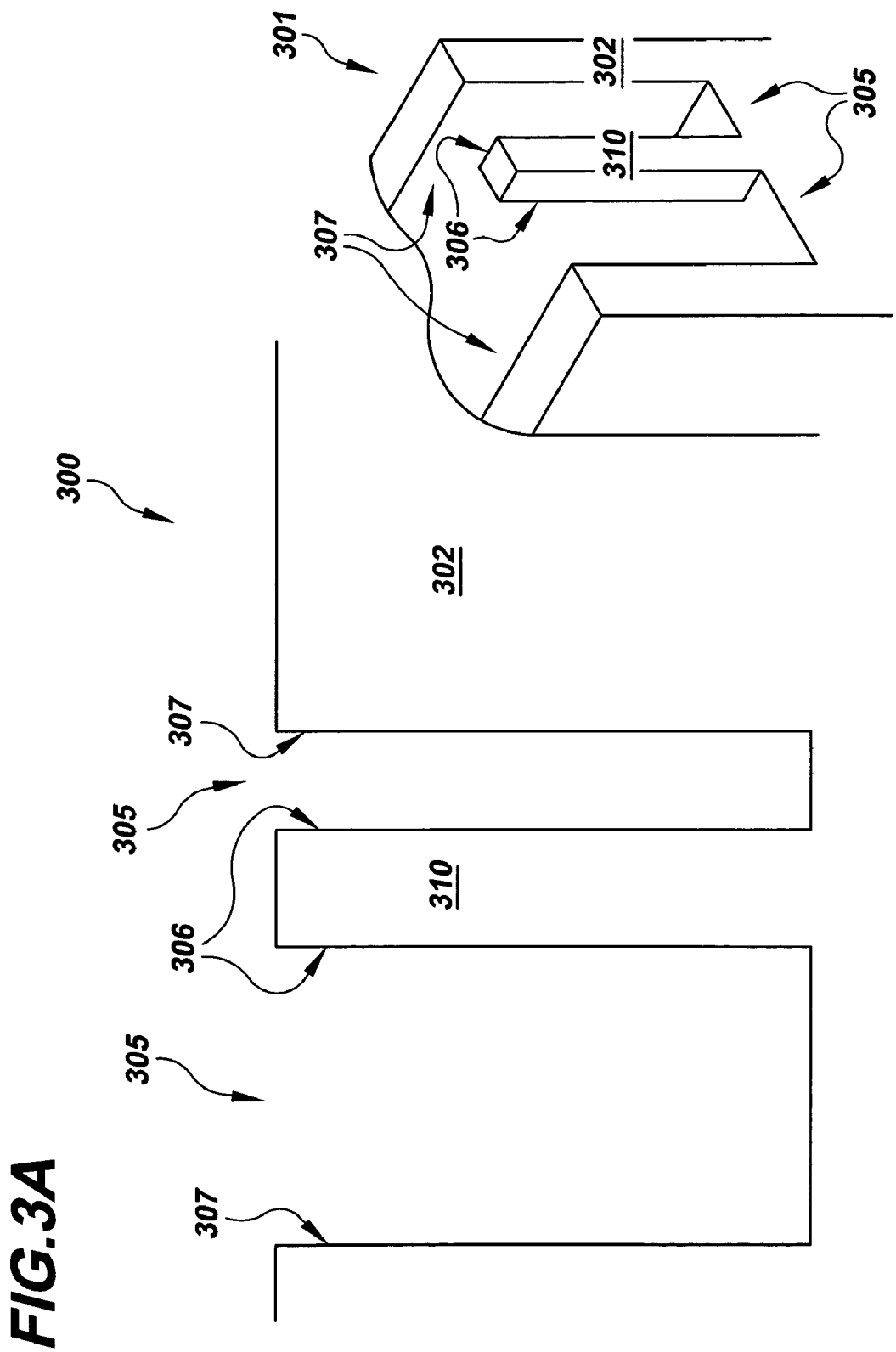

FIGS. 3A through 3E show cross-sectional views of a semiconductor device 300 including a thyristor and at various stages of manufacture, according to another example embodiment of the present invention. The processes shown in FIGS. 3A–3E and described below may, for example, be used to form one or more devices as described in connection with FIGS. 1A–2. In FIG. 3A, a trench 305 having sidewall portions 306 and 307 is etched in a substrate 302 and adjacent to a dopable thyristor body portion 310 in the substrate. An inset 301 shows a three-dimensional view of the semiconductor device 300 at this stage of manufacture, with the trench 305 shown extending around the thyristor body portion 310.

In FIG. 3B, a portion of the substrate 302 is implanted with an n-type dopant via a bottom portion of the trench 305 to form an N-well region 315, with portion 314 thereof forming an N-base region of the thyristor body region 310. In one implementation, the N-base and N-well regions 314 and 315 are diffused using heat to bring the N-base above the bottom of the trench 305. After the N-well 315 implant, a P+ emitter region 312 is implanted in the N-well region 315 via the bottom portion of the trench. The N-base region 314 and the P+ emitter region 312 form an anode end portion of a thyristor body that includes thyristor body region 310.

Figure 3C:
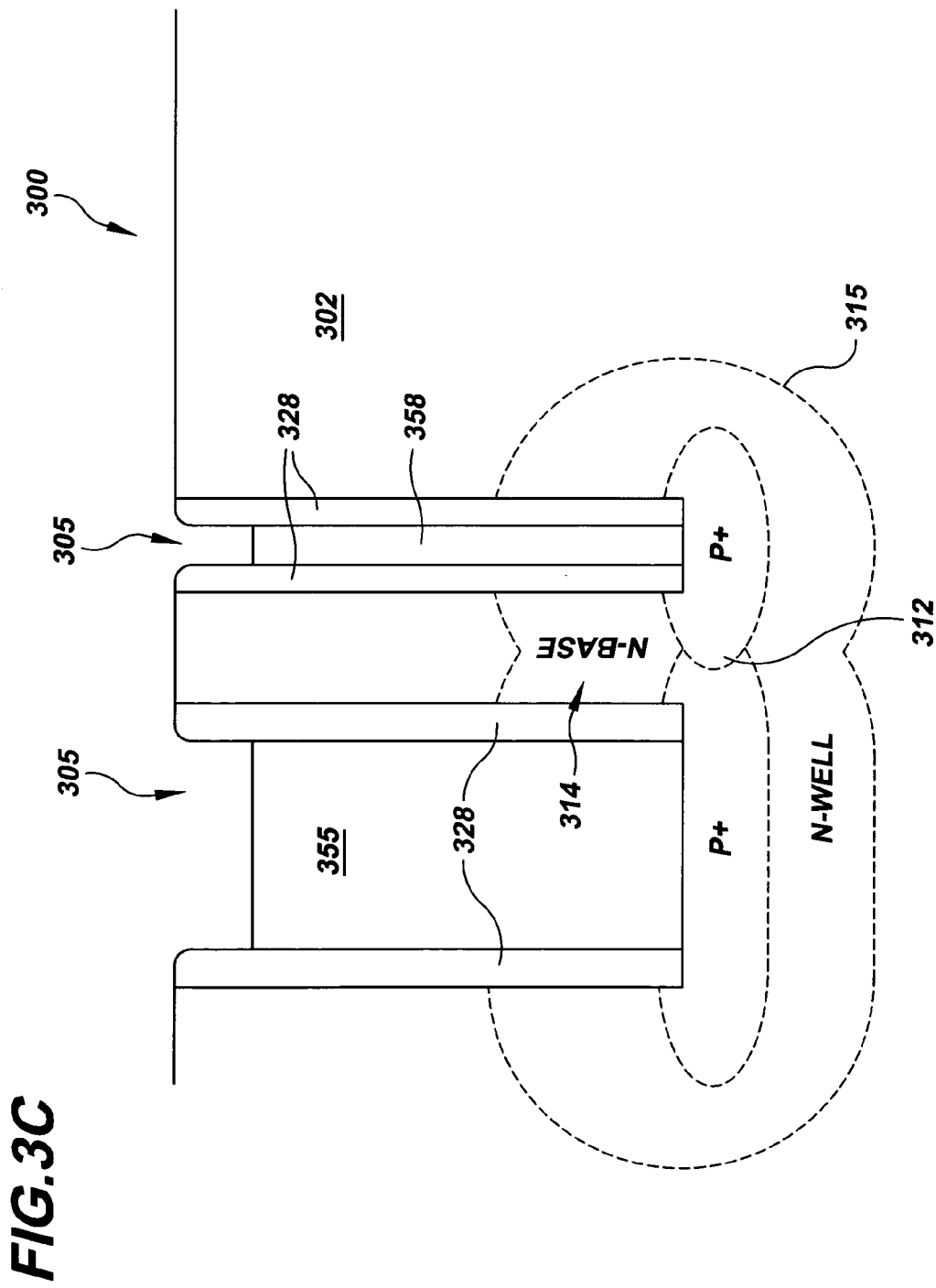

In FIG. 3C, the trench 305 is shown having been lined with an electrically insulative material 328, such as an oxide. The electrically insulative material can be grown and/or deposited and then anisotropically etched to form the liner. The lined trench is filled with a conductive material 355, such as doped polysilicon, other dopable material and/or metal. The insulative liner 328 electrically isolates the conductive material 355 from adjacent circuitry, including the thyristor body portion 310.

FIG. 3D shows the device 300 at a further stage of manufacture, with an upper center portion 357 of the conductive material 355 having been masked and with the conductive material 355 having been subsequently etched. The etching results in the upper center portion 357 of the conductive material 355 extending laterally within outer portions of a lower portion 356 of the conductive contact 355.

FIG. 3E shows the device 300 at a later stage of manufacture, with unfilled portions of the trench 305 having been lined with additional insulative material and filled with a conductive material 355, shown having been etched to form a lower portion 356 and an upper portion 357. The dielectric material 322 and 329 is formed on sidewalls of the trench 305 and around the upper portion 357 of the conductive anode contact material 355. N+ polysilicon material 320 (e.g., a thyristor control port) is deposited on and adjacent to the dielectric materials 329 and 322, and etched back and recessed below an N+ emitter region 318. In one implementation, the upper portion 357 of the conductive filler material and the N+ polysilicon material 320 are simultaneously etched back. The dielectric material 329 electrically insulates the N+ polysilicon material 320 from the P+ anode contact 355. The trench is then filled with an insulative material and planarized with CMP or another process. Insulative material 391 is then deposited to fill remaining unfilled portions of the trench.

The thyristor body region 310 has been further implanted to form an N+ cathode end portion of the thyristor body including a P-base region 316 and an N+ emitter region 318. The N+ polysilicon material 320 is implemented as a control port for capacitively coupling to P-base region 316 via the dielectric material 322 in a manner similar to the implementation of the control ports discussed in connection with FIGS. 1B and 2. The insulative material 328 electrically isolates the P+ anode contact region 356 and the P+ conductive material 356 from the thyristor body region 310 and from other circuitry, (e.g., from additional thyristors when implemented in an array of such devices, as discussed in connection with FIG. 4 below).

Figure 4:
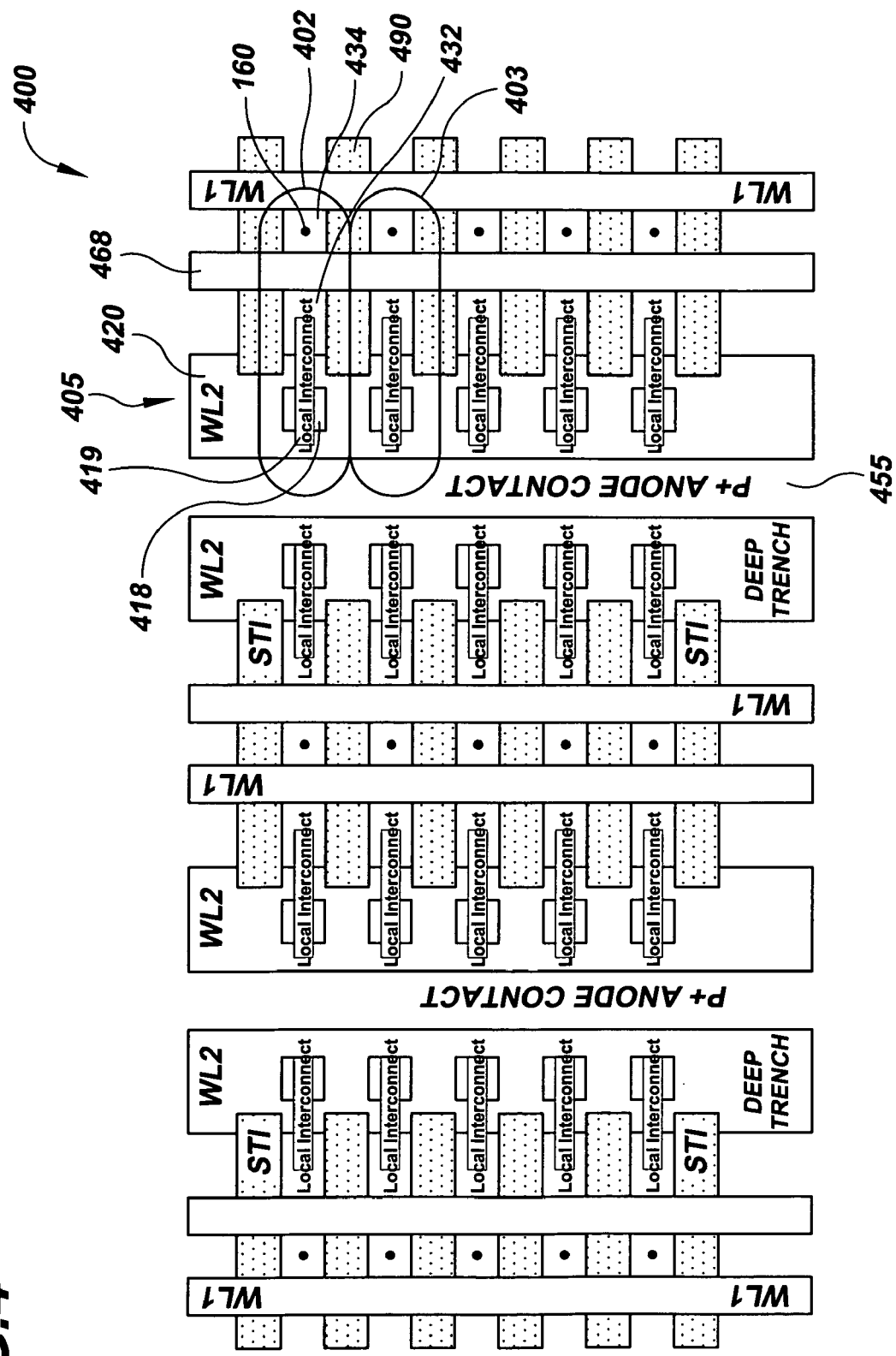
FIG. 4 is a memory array having thyristor-based semiconductor devices having a conductive contact with a varied width in a trench, according to another example embodiment of the present invention.

The example embodiments described herein are applicable to a variety of implementations. In this regard, FIG. 4 shows a memory implementation having a plurality of thyristor-based devices in a memory array 400, according to another example embodiment of the present invention. The array 400 includes memory cells, such as cell 402, separated by shallow trench isolation (STI) 490 from an adjacent memory cell 403, with each memory cell being adapted to store information. Using cell 402 as an example, word line 468 forms the gate of a pass device having source/drain regions 432 and 434 (e.g., similar to logic device 130 of FIG. 1B). The cell 402 further includes a thyristor having vertical portions with an N+ cathode region 418 at an upper portion and coupled in series with the pass device via local interconnect 419. A control port 420 formed in a trench 405 around the thyristor is arranged for capacitively coupling to the thyristor for controlling current flow therein. The trench 405 further includes a filled lower portion including a lower portion of a P+ anode contact 455 surrounded by a trench liner (e.g., such as liner 128 shown in FIG. 1B) adapted to electrically isolate a portion of the thyristor from the P+ anode contact. The filled lower portion of the trench may include one or more of similar materials shown in the other figures, such as the conductive materials 155 (including portions 156 and 157), and insulative liner 128 of FIG. 1B. The lower portion of the P+ anode contact 455 extends laterally beyond sidewalls of an upper portion thereof, such as the P+ anode contact shown in FIGS. 1B and 2, respectively.

As an alternative approach, any of the above embodiments can be modified using the approach(es) illustrated and described in concurrently-filed U.S. Provisional Patent Application Ser. No. 60/415,356, entitled "Novel Minority Carrier Isolation Device."

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN sections in the thyristor; and interchanging P and N regions in the device structures and/or using PMOSFETS rather than NMOSFETS. In addition, for general information regarding thyristors including thin capacitively-coupled thyristors, and for particular information regarding implementations to which the present invention is applicable and their respective operations, reference may be made to the above-referenced U.S. Patent (Nemati, et al.), which is fully incorporated herein by reference. Such modifications and changes do not depart from the true spirit and scope of the present invention that is set forth in the following claims.

The invention claimed is:

1. A memory cell comprising:
   a thyristor body having first and second end portions, each end portion having a base region and an emitter region, at least one of the end portions being in a substrate;
   a filled trench in the substrate laterally adjacent to said base region of the end portion in the substrate, the filled trench having an insulative liner material on a sidewall thereof;
   a current shunt in the filled trench, the current shunt being configured and arranged to provide a current-shunting path between the emitter region of the thyristor body end portion in the substrate and a circuit node near the upper portion of the current shunt, the insulative liner material being adapted to electrically insulate the current shunt from the thyristor body;
   a transistor having first and second source/drain regions separated by a channel and a gate adapted for controlling current flow in the pass device, the first source/drain region being coupled in series with the thyristor via an emitter regions of the first thyristor end portion, the gate being part of a first word line;
   a thyristor control port in the lined trench, over the lower portion and laterally adjacent to the upper portion of the current shunt, the control port being part of a second word line and adapted for capacitively coupling to the thyristor body via a dielectric material for controlling current in the thyristor body;
   a bit line electrically coupled to the second source/drain region of the pass device;
   a reference voltage line coupled to the emitter region of the second thyristor end portion; and
   an access controller configured and arranged for controlling the first and second word lines, the bit line and the reference voltage line for storage and manipulation of data at the emitter region of the first thyristor end portion.

2. A semiconductor device having a substrate, the device comprising:
   a thyristor having at least one body region below a surface of the substrate and a thyristor control port configured and arranged for capacitively coupling to the at least one thyristor body region for controlling current flow therein; and
   a current shunt in a filled trench below the surface of the substrate and disposed laterally adjacent to said at least one body region, the thyristor control port being in the filled trench, and the current shunt being adapted to provide a current-shunting path between a circuit node of the thyristor near a lower portion of the current shunt and another circuit node near an upper portion of the current shunt.

3. The semiconductor device of claim 2, wherein the thyristor is a thin capacitively-coupled thyristor.

4. The semiconductor device of claim 2, wherein the filled trench and the thyristor control port extend laterally around said at least one thyristor body region.

5. The semiconductor device of claim 4, wherein the filled trench has a relatively narrower portion and a relatively wider portion, wherein a lower portion of the current shunt fills a lower portion of a relatively narrow portion and wherein at least a portion of the control port is disposed over the lower portion of the current shunt.

6. The semiconductor device of claim 2, further comprising an insulative material between the current shunt and the control port.

7. The semiconductor device of claim 6, wherein the current shunt has an upper portion that is narrower than a lower portion thereof, wherein the control port is disposed over the lower portion and laterally adjacent to the upper portion of the current shunt.

8. The semiconductor device of claim 7, further comprising a dielectric material on a sidewall of the filled trench between the control port and the thyristor body region in the substrate, wherein the control port is adapted to capacitively couple to the at least one thyristor body region via the dielectric material.

9. The semiconductor device of claim 7, further comprising:
   a second thyristor having at least one body region disposed in the substrate; and
   a second thyristor control port in the lined trench, disposed over the lower portion and laterally adjacent to the upper portion of the current shunt, the current shunt being between said thyristor control port and the second thyristor control port, the second thyristor control port being adapted to capacitively couple to the second thyristor body region for controlling current in the second thyristor body region.

10. The semiconductor device of claim 2, wherein the filled trench extends into a well portion and a base portion of the thyristor, the thyristor further comprising:
    a first emitter region in the substrate below the filled trench;
    a first base region in said at least one thyristor body region and adjacent to a first portion of the trench;
    a second base region in said at least one thyristor body region, over the first base region and adjacent to a second portion of the trench; and
    a second emitter region coupled to the second base region.

11. The semiconductor device of claim 10, further comprising a pass device coupled in series with the thyristor and having first and second source/drain regions separated by a channel and a gate over the channel, the gate being adapted for switching the pass device between a blocking state and a conducting state in response to a voltage being applied thereto.

12. The semiconductor device of claim 11, wherein the first emitter region is electrically coupled to the first source/drain region via the current shunt.

13. The semiconductor device of claim 11, wherein the second emitter region is electrically coupled to the first source/drain region.

14. The semiconductor device of claim 13, wherein the second emitter region is adapted for storing data and wherein the control port and the gate are configured and arranged for controlling access to the stored data.

15. The memory cell of claim 14, wherein the current shunt is electrically coupled to a reference voltage line and configured and arranged for shunting current between the first emitter region and the reference voltage line, wherein the second source/drain region is electrically coupled to a bit line, further comprising an access controller configured and arranged for controlling the reference voltage line, the bit line, the control port and the gate for data storage and manipulation at the first emitter region.

* * * * *